(12) United States Patent
Rio Doval

(10) Patent No.: US 7,091,884 B2
(45) Date of Patent: Aug. 15, 2006

(54) ANALOG POSITION ENCODER

(75) Inventor: Jose M. Rio Doval, Barcelona (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 9 days.

(21) Appl. No.: 10/947,146

(22) Filed: Sep. 23, 2004

(65) Prior Publication Data

US 2005/0092904 A1    May 5, 2005

(30) Foreign Application Priority Data

Sep. 26, 2003   (EP)   ................................. 03103582

(51) Int. Cl.
*H03M 1/22* (2006.01)
*G01D 5/34* (2006.01)
(52) U.S. Cl. .................... 341/13; 341/2; 250/231.18
(58) Field of Classification Search ................ 341/113, 341/2, 13; 250/231.13, 208.2, 208.3, 231.15, 250/231.18; 318/594; 324/202, 207.17; 340/870.29; 358/1.5; 702/158; 356/485
See application file for complete search history.

(56) References Cited

U.S. PATENT DOCUMENTS

| | | | | |
|---|---|---|---|---|
| 3,808,431 | A * | 4/1974 | Hedrick ........................ | 341/2 |
| 3,987,297 | A * | 10/1976 | Brienza et al. .......... | 250/208.3 |
| 4,377,807 | A * | 3/1983 | Freeman ........................ | 341/2 |
| 4,621,224 | A * | 11/1986 | Watabe et al. .............. | 318/594 |
| 4,660,036 | A * | 4/1987 | Mosier .................. | 340/870.29 |
| 4,703,309 | A * | 10/1987 | Krohn ........................ | 341/13 |
| 4,985,691 | A * | 1/1991 | Pulyer et al. ................ | 336/130 |
| 5,021,781 | A * | 6/1991 | Salazar et al. ................. | 341/13 |
| 5,055,668 | A * | 10/1991 | French ..................... | 250/208.2 |
| 5,148,600 | A * | 9/1992 | Chen et al. .................. | 33/1 M |
| 5,299,143 | A | 3/1994 | Hellinga et al. ............ | 702/158 |
| 5,696,589 | A * | 12/1997 | Bernacki ..................... | 356/630 |
| 6,242,906 | B1 * | 6/2001 | Andermo ..................... | 324/202 |
| 6,335,618 | B1 * | 1/2002 | Nahum .................. | 324/207.17 |
| 6,525,837 | B1 | 2/2003 | Adkins et al. ............... | 358/1.5 |
| 6,600,150 | B1 | 7/2003 | Adkins et al. ......... | 250/231.13 |
| 6,759,973 | B1 * | 7/2004 | Villaret et al. ................ | 341/11 |
| 6,781,694 | B1 * | 8/2004 | Nahum et al. .............. | 356/420 |
| 6,966,623 | B1 * | 11/2005 | Fo et al. ....................... | 347/19 |
| 6,998,601 | B1 * | 2/2006 | Chin et al. ............. | 250/231.13 |
| 2001/0048073 | A1 | 12/2001 | Suzuki et al. | |

FOREIGN PATENT DOCUMENTS

| | | |
|---|---|---|
| EP | 0 680 829 | 11/1995 |
| GB | 1 248 742 | 10/1971 |

* cited by examiner

*Primary Examiner*—Patrick Wamsley
(74) *Attorney, Agent, or Firm*—Foley & Lardner LLP

(57) ABSTRACT

A position-measuring circuit is described for use with an analog position encoder of the kind comprising a code member and at least two sensors for sensing successive marks on the code member during relative movement between the code member and sensors, the sensors providing two oscillating quadrature signals. The circuit comprising means for obtaining a relatively coarse measure of position by detecting successive instants $t0$–$t3$ at which the amplitudes of the sensor signals are equal or at which the amplitude of one signal is equal to the inverse of the amplitude of the other signal. The amplitude of one of the signals or its inverse is stored at each detection instant to alternately establish relatively high and low threshold levels. A fine measure of position at an arbitrary instant $T$ is obtained as a function of the instantaneous amplitude $P$ of one of the signals and the difference between neighbouring high and low thresholds levels.

11 Claims, 5 Drawing Sheets

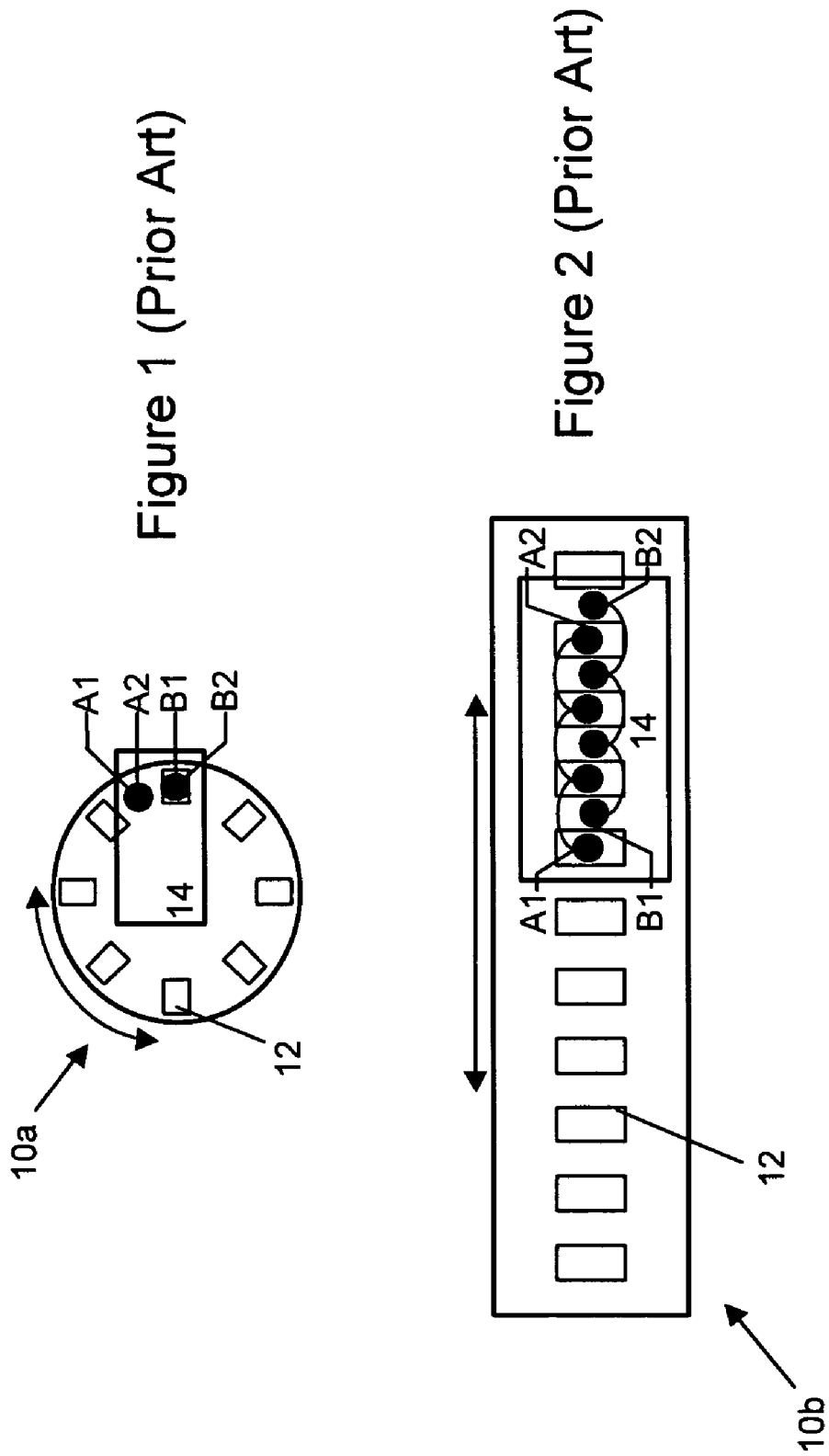

ANALOG POSITION ENCODER

FIELD OF THE INVENTION

This present invention relates to position encoders. Particularly, the invention relates to a position-measuring circuit for use with an analog position encoder.

BACKGROUND OF THE INVENTION

Position encoders are used in many different systems to sense the position of different parts, subsystems, etc. One such system is a large format printer where several encoders are typically used to sense paper position, carriage position, etc.

A common encoder is based on optical technology and comprises a codewheel 10a in the case of a rotary encoder, FIG. 1, or a codestrip 10b in the case of a linear encoder, FIG. 2. Generally, each codewheel or codestrip (herein collectively referred to as "code members") contains marks 12 which are optically distinct either in terms of reflectance or transmissivity from their background. The wheel or strip moves past an optical sensor 14 which picks up reflected or transmitted light from a light source (not shown) modulated by the marks moving across the sensor's field of view. In FIG. 1 the sensor comprises two individual elements, whereas in FIG. 2 the sensor comprises two series of interleaved elements. In both cases, the light incident on the sensors causes the sensors to produce two oscillating quadrature (i.e. 90° out of phase) voltage signals A=(A1–A2) and B=(B1–B2) from which it is possible to derive positional information.

In digital encoders, the sequence of marks in the code member are sensed to generate analog quadrature signals which are digitised, typically by being fed through respective Schmidt triggers. The edges of the digital signals are then used to derive the position information. The resolution of the encoder is dictated by the number of the codestrip marks over a given distance travelled (linear encoders) or over a given angle (rotary encoders).

Analog encoders generate, for example, sinusoidal or rounded edge triangular signals—the shape of the waveform being determined by the shape of the optical sensors and the encoded marks. Examples of such encoders are produced by Agilent under the product numbers QEDS 9852/9855 and QEDS 9862/9863.

Certain distinguishable instants in the two sensor signals that are used to obtain the digital signals in digital encoders are still needed in analog encoders to derive the position information. They can be the zero crossing points of the analog signals or the points where the amplitude of the two signals is the same. The main advantage of the analog encoders is that it is possible to increase the system resolution over that of a digital encoder using the same code member. These techniques involve the calculation of the phase angle of the signal so that the position between two digital edges can be calculated.

The most common technique for encoders whose sensors have a sinusoidal output is shown in FIG. 3. Signals A and B are the analog encoder outputs as described above, voltage shifted to oscillate about zero volts, while DIG A and DIG B represent digital signals derived from the instants when the signals A and B respectively cross the zero line. The quadrature digital signals DIG A and DIG B feed a digital counter (CTR) that provides a coarse measure of position, and is used to compute direction of movement and displacement to "digital" accuracy. To provide a fine measure of position at an arbitrary instant T, the amplitudes of signals A and B at the instant T are measured and, since the shape of the curves A and B is known, the associated electrical angle or phase displacement (PHASE) from the last crossing point is computed from them. The combination of the counter value and the phase displacement provides fine position resolution.

However, the mathematics required involves the calculation of trigonometric functions and is usually performed in some type of processor (generic CPU or a DSP (digital signal processor)). An advantage of such encoders is that by determining phase displacement, the encoders can be made independent of the amplitude of the quadrature signals A and B. This means that even if the code member or sensors degrade over time, the phase relationship of the quadrature signals should still be retained and correct measurements should still be made.

For encoders with triangular output signals having rounded maxima and minima, the above technique cannot be applied without a degradation of resolution so the amplitude of one of the sensor output signals is used instead to determine phase angle. This type of encoder is specially applicable to low cost systems because of the lower costs of the sensor itself and the associated electronics (it requires a single measurement instead of the two synchronous measurements required to measure the A and B amplitudes in the case of sinusoidal outputs, as well as reduced computations).

FIG. 4 is an example of the operation of such an encoder. Signals A and B (voltage shifted to oscillate about zero volts) are the sensor outputs, and are essentially triangular signals with rounded maxima and minima; the segments enclosed between the lines labelled LOW and HIGH are straight lines and the rounded maxima and minima, as well as the straight line segments, each occupy ¼ of the signal period. In each cycle of the signals, the instants $t_0$ and $t_2$ where the amplitude of the two signals are equal (A=B) and the instants $t_1$ and $t_3$ where the amplitude of one signal is equal to the inverse of the amplitude of the other (A=–B), as indicated on FIG. 4, are the distinguishable instants used to derive the digital signals DIG A and DIG B used to feed the digital counter (CTR). This, as before, provides a coarse measure of position. To obtain higher resolution position information, the instantaneous amplitude of one of the analog signals at the arbitrary measurement instant T is measured, the particular signal chosen being that which has a straight line in the relevant quadrant. Thus, in the example of FIG. 4, the amplitude of signal B is measured at point P while the encoder counter contains the "n+1" value. This value is scaled to the difference between the LOW and HIGH levels to obtain the instantaneous value of Signal B as a proportion of the difference between the LOW and HIGH levels, which is used to derive the fine position information.

As mentioned, the particular signal (A or B) whose instantaneous amplitude value is measured to determine the fine position depends upon the particular quarter cycle in which the measurement instant T lies, since the chosen signal is that having a straight line in the relevant quadrant. Thus, signal A would be used for counter values n, n+2, etc. while signal B would be used for counter values n+1, n+3, etc. In fact if an inverse signal is available, then A can be used for n=1, not B for n+1, not A for n+2 and B for n+3, so providing linearly increasing monotonic values ranging from low to high during each quarter cycle. These values can be combined with the counter value indicating the specific quarter cycle to give a continuously increasing value across the full range of the encoder.

This technique tends to fail when the amplitude of the encoder signals is not constant. This is not an uncommon situation and several factors contribute to this behaviour:

Different amplitude ranges of the signals A and B in the two encoder channels.

Mechanical errors in the codewheel, for example, eccentricity, warp.

Degradation of the codewheel through, for example, the application of aerosol cleaning products.

In real conditions, the values of the HIGH and LOW threshold levels, which define the upper and lower limits of the straight line portions of the signals A and B, cannot be represented as parallel straight lines. They change with the sensor position and possibly over time, making it difficult to accurately compute the fine position using the above technique. Their variation limits the maximum number of quantization levels (steps) the measurement system can use without introducing errors, thus reducing the effective resolution and/or inducing position errors. The position errors negatively affect the system and, for instance, in a printer can appear as defects in image quality.

Different calibration techniques are used to compensate for these defects. The most common one consists of calibrating the encoder subsystem section by section. The value of the HIGH and LOW levels is measured at different positions of the sensor (different angles on a rotary encoder or different positions on a linear one) and an interpolation technique is used to calculate intermediate points. The calibration must be repeated from time to time to compensate for time-related degradations (aerosol, encoder sensor, etc.), which is time consuming. In many cases, the calibration can only be run at low speeds, so it is not fully representative of when the system operates at higher speeds.

It is an object of the invention to provide a position-measuring circuit for use with an analog position encoder which can provide improved resolution and simplified calibration procedures.

DISCLOSURE OF THE INVENTION

Accordingly, one aspect of the present invention provides a position-measuring circuit for use with an analog position encoder comprising a code member and at least one sensor for sensing successive marks on the code member during relative movement between the code member and sensor and providing an oscillating signal in response thereto, the position-measuring circuit comprising means for obtaining a relatively coarse measure of position by detecting successive distinguishable instants in the signal, means for establishing relatively high and low threshold levels based upon the amplitudes of the signal at least at selected detection instants, and means for obtaining a fine measure of position as a function of the instantaneous amplitude of the signal and the difference between neighbouring high and low threshold levels.

In a preferred embodiment the analog position encoder has at least two sensors providing two oscillating quadrature signals, the distinguishable instants are the instants at which the amplitudes of the sensor signals are equal and at which the amplitude of one sensor signal is equal to the amplitude of the inverse of the other sensor signal, and the means for obtaining a fine measure of position obtains said measure as a function of the instantaneous amplitude of a selected one of the signals and the difference between neighbouring high and low threshold levels, the selected signal being that signal which changes monotonically between said neighbouring high and low threshold levels.

BRIEF DESCRIPTION OF THE DRAWINGS

Preferred embodiments of the invention will now be described with reference to the accompanying drawings, in which:

FIGS. 1 and 2 illustrate conventional analog position encoders;

DESCRIPTION OF PREFERRED EMBODIMENTS

Referring again to FIG. 4, the basic idea underlying the embodiments is that the instants which define the edges of the digital signals DIG A and DIG B, that is to say, the instants $t_0$ to $t_3$ in each signal cycle where A=B and A=−B, are also used to dynamically set the threshold levels HIGH and LOW. Therefore, the HIGH and LOW thresholds follow the signals rather than being pre-set in some prior calibration process.

Thus, at $t_0$ (A=B) the HIGH threshold level is set at the instantaneous amplitude of signal A which is high at that instant, at $t_1$ (A=−B) the LOW threshold level is set at the instantaneous amplitude of signal B which is low at that instant, at $t_2$ (A=B) the HIGH threshold level is set at the inverse of the instantaneous amplitude of signal A (or signal B) since A and B are both low at that instant, at $t_3$ (A=−B) the LOW threshold level is set at the instantaneous amplitude of signal A which is low at that instant, and so on for subsequent cycles of the signals A and B.

It will be understood that in the present specification the inverse of a signal, such as the signal A or B, means the reflection of that signal about its median value. In the present case, where the signals A and B are voltage shifted to oscillate about zero volts, the amplitude of the signal and its inverse at any given instant are of equal amplitude but opposite sign. However, in the case, for example, of a signal which oscillated between 0 volts and +5 volts, the inverse of the signal would be the reflection of the signal about the +2.5 volt axis. In such a case the inverse of 4 volts would be 1 volt.

Thus the HIGH and LOW threshold levels are alternately established "on the fly", each new HIGH threshold level replacing the previous HIGH threshold level and each new LOW threshold level replacing the previous LOW threshold level. Now, the instantaneous amplitude of the signal A or B at the measurement instant T is scaled to the most recently dynamically established HIGH and LOW threshold levels, rather than to predetermined levels set during a prior calibration.

Figure 5:
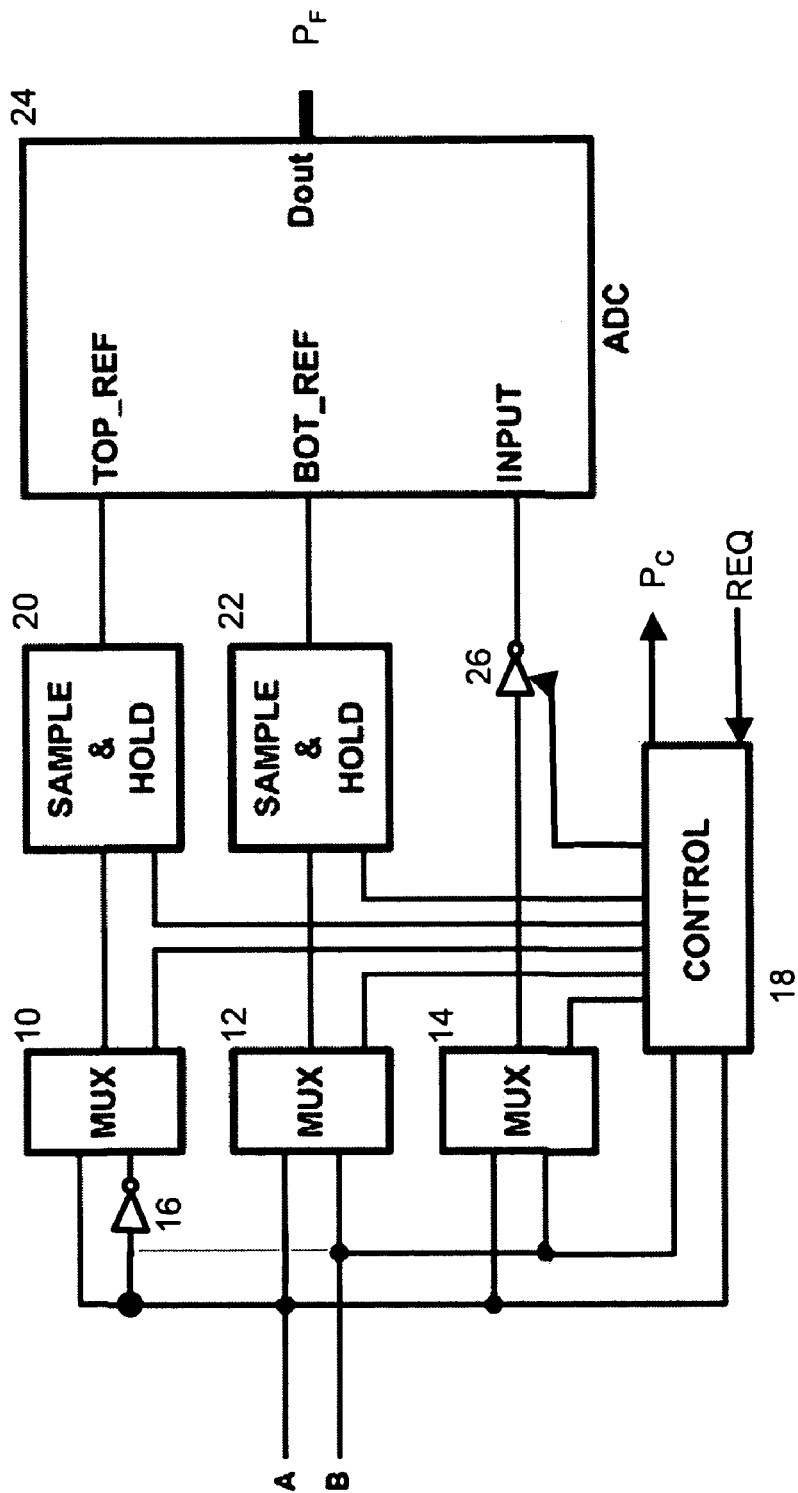
FIG. 5 is a block diagram of a first embodiment of the present invention.

FIG. 5 is a block diagram of a first embodiment of the invention for carrying out the above method. The sensor signals A and B are connected to three multiplexers (MUX) 10, 12 and 14. In particular, signal A and its inverse (via an inverter 16) are fed to respective inputs of MUX 10, and signals A and B are fed to respective inputs of each MUX 12 and 14. Finally, signals A and B are fed to respective inputs of a control unit 18. The outputs of the MUXs 10 and 12 are input to respective sample and hold circuits 20 and 22.

The control unit 18 is essentially a logic circuit which, from the amplitudes of signals A and B input to it, identifies the instants $t_0$ to $t_3$ in each signal cycle. Upon detection of each such instant, a counter (not shown) is incremented by one and the cumulative result is output as a coarse position signal $P_C$.

In addition the control unit 18 controls the MUXs 10, 12 and the corresponding sample and hold circuits 20, 22 such that at $t_0$ the current value of A is latched into sample and hold circuit 20, at $t_1$ the current value of B is latched into sample and hold circuit 22, at $t_2$ the inverse of the current value of A is latched into sample and hold circuit 20, at $t_3$ the current value of A is latched into sample and hold circuit 20, and so on for subsequent signal cycles, each value set into a sample and hold circuit 20, 22 replacing the value previously therein. (It will be seen that in this embodiment, the multiplexer 12 is not strictly necessary as only signal B needs to be latched into sample and hold circuit 22.)

The current values held in the sample and hold circuits 20, 22 are applied to respective inputs TOP_REF and BOT_REF of a analog to digital converter (ADC) 24 and serve as the HIGH and LOW threshold levels which change dynamically with changes in the amplitudes of the signals A and B.

When a position measurement is required, a request signal REQ (which may be a polling signal or an interrupt signal) is applied to the control unit 18. In response, the control unit 18 provides an input to the MUX 14 to sample one of the signals A and B and pass its instantaneous amplitude to the input I/P of the ADC 24. The particular signal A or B selected is, of course, that having a straight line in the current quadrant. Thus, signal A is chosen in quadrants $t_1-t_2$ and $t_3-t_0$ and signal B is chosen in quadrants $t_2-t_3$ and $t_0-t_1$. In order to ensure that all signals applied to the ADC input I/P are changing in the same direction at the instant they are sampled, either the signals A and B are inverted during quadrants $t_2-t_3$ and $t_3-t_0$ respectively, or they are inverted during quadrants $t_0-t_1$ and $t_1-t_2$ respectively. This is effected with a further inverter 26 under the control of the control unit 18.

Finally, the signal amplitude applied to the input I/P in response to the request signal REQ is ADC converted within the range defined by TOP_REF and BOT_REF, which scales the amplitude to the difference between these values. The result, at the output $D_{out}$ of the ADC, is a fine position signal $P_F$. $P_F$ and $P_C$ together uniquely define the position of the code member.

Figure 6:
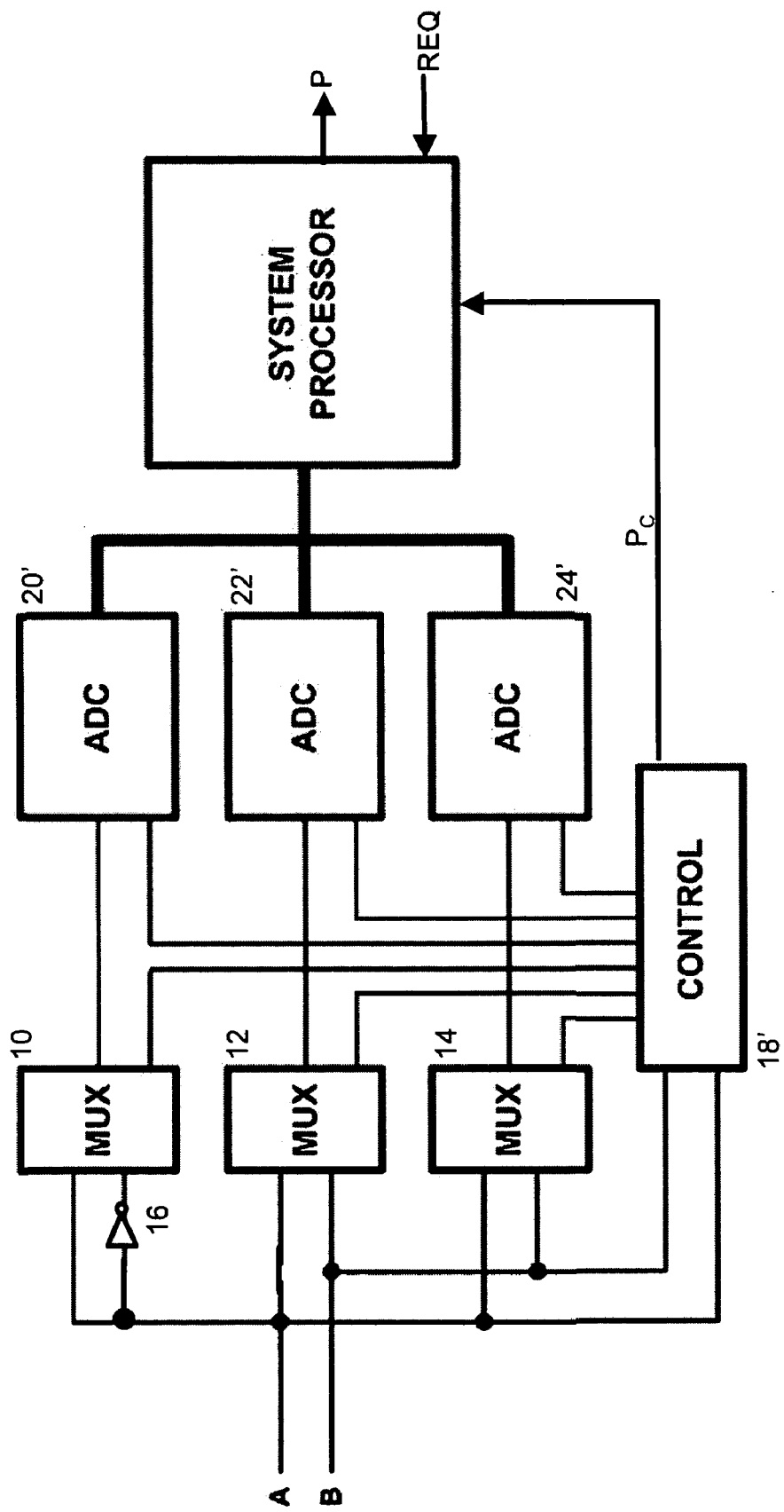
FIG. 6 is a block diagram of a second embodiment of the present invention.

FIG. 5 is a primarily hardware implementation of the invention. However, the invention can also be implemented primarily in software, as shown in FIG. 6. In this case separate ADCs 20', 22' and 24' are used to determine digital values for each of the TOP_REF, BOT_REF and INPUT values respectively. Each ADC is supplied with the same static upper reference and lower reference voltage, which should always be above and below the measured values of A and B respectively. The output of each ADC is fed to a system processor which communicates with external circuitry. Again, a modified control unit 18' determines which of the values of signals A, inverse A or B are to be fed through to the ADCs 20', 22' at times t0, t1, t2, or t3 to update the values of TOP_REF and BOT_REF. Either the control unit or the system processor can decide at which time the instantaneous value of either A or B must be measured by ADC 24' and whether this needs to be inverted prior to being measured by the ADC or within the system processor itself. In any case, the digital data supplied by the ADCs is used by the system processor to compute the fine position $P_F$ Of the code member and combines this with the coarse position $P_C$ to uniquely define the position $P_{OUT}$ of the code member.

The described system tracks and corrects any amplitude change due to environmental conditions variation (temperature, humidity, etc.) or due to aging (aerosol, sensor degradation, etc.) without the need to re-run slow calibration cycles. It reduces the position errors to allow an increase in the effective encoder resolution, which is particularly advantageous in many systems and especially in high resolution printers (2400 dpi or more on the paper axis).

It also can help to detect an abnormal encoder operation (for instance dips in the sequence of marks due to scratches, aerosol, etc.) thus simplifying the maintenance of the unit.

Various modifications can be made to the above embodiments. For example, it is not necessary to set the relevant one of the HIGH and LOW threshold levels at each of the instants t0 to t3. One could just use the amplitude of signal A at t0 and t2 to give the running HIGH and LOW threshold levels respectively; this would avoid the need for the inverter 16. Another possibility would be to use just the inverse of signal B at instants t1 and t3 to give the HIGH and LOW threshold levels respectively. This would mean that the HIGH and LOW threshold levels were adjusted only half as often as the counter CTR is incremented, but this may be acceptable where the amplitude drift is slow. Many other variations are possible. For example, the HIGH and LOW threshold levels could be adjusted at intervals of more than one signal cycle. What is important is that any drift in the maximum amplitude of the signals A and B is tracked sufficiently closely to provide the degree of compensation necessary for the application in hand.

Figure 3:
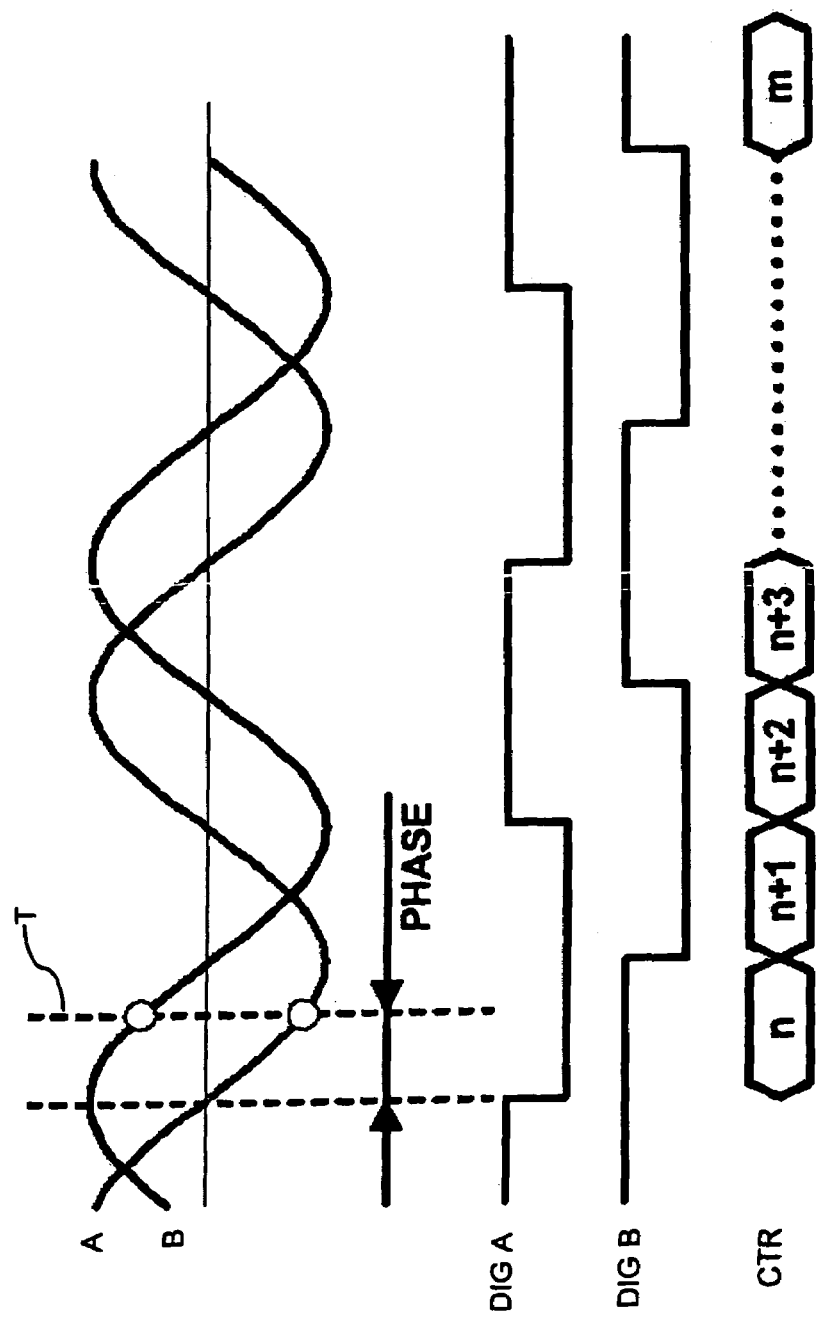
FIG. 3 illustrates the operation of a conventional sinusoidal encoder.
Figure 4:
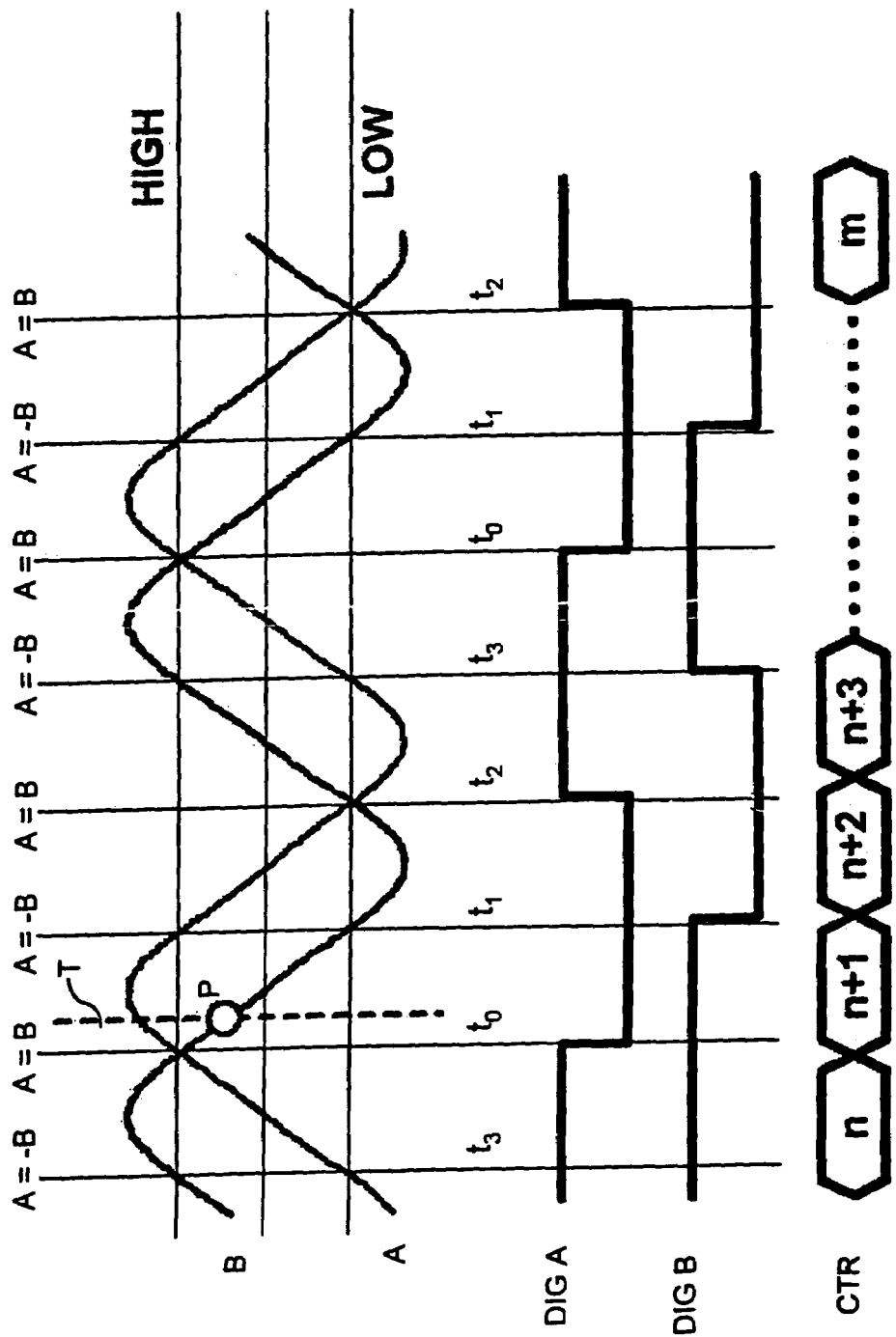
FIG. 4 illustrates the operation of a conventional triangular encoder.

In a variation of the preceding embodiments, when determining the HIGH-LOW range the most recent high or low threshold level and the next low or high threshold level respectively can be used; for example, in the case of the point P, FIG. 4, the HIGH threshold level at $t_0$ and the LOW threshold level at $t_1$. This is acceptable only for systems where the measurement latency is acceptable, since the instant $t_1$ occurs after the measurement instant T and the system has to wait until $t_1$ before it can calculate the position at T (and $t_1$ may not even occur if the direction of movement changes). This can be achieved in FIG. 5, for example, by temporarily storing the instantaneous value of signal A or B occurring at instant T in MUX 14 and releasing it to the ADC only upon the occurrence of $t_1$. This can be readily controlled by the control unit 18.

The invention is also not limited to triangular signals with rounded maxima and minima. Any signal can be used that increases or decreases monotonically between HIGH and LOW thresholds, although where this is not a straight line a more complex calculation will be involved.

Although the foregoing has described embodiments where two optical sensors are used to produce two oscillating quadrature signals, the invention is also applicable to analog position encoders having a single optical sensor producing a single oscillating signal. In such a case the coarse position signal can be obtained by detecting the maxima and minima of the signal, for example by differentiation, which can also be used to adjust the HIGH and LOW thresholds. The fine signal is then derived as a function of the instantaneous amplitude of the signal and the difference between the current HIGH and LOW thresholds.

The invention is not limited to the embodiments described herein and may be modified or varied without departing from the scope of the invention.

What is claimed is:

1. A position-measuring circuit for use with an analog position encoder comprising a code member and at least one sensor for sensing successive marks on the code member during relative movement between the code member and sensor and providing an oscillating signal in response thereto, the position-measuring circuit comprising means for obtaining a relatively coarse measure of position by detecting successive distinguishable instants in the signal, means for establishing relatively high and low threshold levels based upon the amplitudes of the signal at least at selected detection instants, wherein a value of the high and low threshold levels vary with the sensor position and/or over time, and are set to change dynamically with an amplitude of the signal during operation of the analog position encoder, and means for obtaining a fine measure of position by measuring an instantaneous amplitude of the signal and calculating the fine measure as a function of the instantaneous amplitude of the signal and the difference between neighboring high and low threshold levels.

2. A circuit as claimed in claim 1, wherein the analog position encoder has at least two sensors providing two oscillating quadrature signals, wherein the distinguishable instants are the instants at which the amplitudes of the sensor signals are equal and at which the amplitude of one sensor signal is equal to the amplitude of the inverse of the other sensor signal, and wherein the means for obtaining a fine measure of position obtains said measure as a function of the instantaneous amplitude of a selected one of the signals and the difference between neighbouring high and low threshold levels, the selected signal being that signal which changes monotonically between said neighboring high and low threshold levels.

3. A circuit as claimed in claim 2, wherein the means for establishing the dynamic threshold levels comprises means for storing the amplitude of one of the signals or its inverse at each, or each selected, detection instant to alternately establish relatively high and low threshold levels.

4. A circuit as claimed in claim 3, wherein the means for establishing the dynamic threshold levels includes two sample and hold circuits for alternately storing the amplitude of one of the signals or its inverse at each, or each selected, detection instant such that the two sample and hold circuits contain the most recent high and low threshold levels respectively.

5. A circuit as claimed in claim 1, wherein the sensor signals are triangular signals with rounded maxima and minima, and the means for obtaining a fine measure of position calculates the instantaneous amplitude of one of the signals as a proportion of the difference between neighbouring high and low thresholds levels.

6. A circuit as claimed in claim 5, wherein the means for obtaining a fine measure of position comprises an analog to digital converter whose range is defined by the established high and low threshold levels and which has the instantaneous signal amplitude as input.

7. A circuit as claimed in claim 1, wherein the neighboring high and low threshold levels are the most recently established high and low threshold levels.

8. A circuit as claimed in claim 1, wherein the neighboring high and low threshold levels are the most recent high or low threshold level and the next low or high threshold level respectively.

9. A printer including one or more analog position encoders according to claim 1, each arranged to sense one of paper position and carriage position.

10. A position-measuring circuit for use with an analog position encoder comprising a code member and at least two sensors for sensing successive marks on the code member during relative movement between the code member and sensors, the sensors providing two oscillating quadrature signals, the position-measuring circuit comprising means for obtaining a relatively coarse measure of position by detecting successive instants at which the amplitudes of the sensor signals are equal and at which the amplitude of one sensor signal is equal to the amplitude of the inverse of the other sensor signal, means for establishing relatively high and low threshold levels based upon the amplitudes of the signals at least at selected detection instants, wherein a value of the high and low threshold levels vary with the sensor position and/or over time, and are therefore set to change dynamically with the amplitude of the signal during operation of the analog position encoder, and means for obtaining a fine measure of position by measuring an instantaneous amplitude of the signal and calculating the fine measure as a function of the instantaneous amplitude of one of the signals and the difference between neighboring high and low threshold levels.

11. A method of determining position using an analog position encoder comprising a code member and at least one sensor for sensing successive marks on the code member during relative movement between the code member and sensor and providing an oscillating signal in response thereto, the method comprising the steps of obtaining a relatively coarse measure of position by detecting successive distinguishable instants in the signal, establishing relatively high and low threshold levels based upon the amplitudes of the signal at least at selected detection instants, wherein a value of the high and low threshold levels vary with the sensor position and/or over time, and are set to change dynamically with an amplitude of the signal during operation of the analog position encoder, and obtaining a fine measure of position by measuring an instantaneous amplitude of the signal and calculating the fine measure as a function of the instantaneous amplitude of the signal and the difference between neighboring high and low threshold levels.

* * * * *